(12) United States Patent
Zha

(10) Patent No.: US 11,515,386 B2
(45) Date of Patent: Nov. 29, 2022

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventor: Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 268 days.

(21) Appl. No.: 16/631,358

(22) PCT Filed: Oct. 15, 2019

(86) PCT No.: PCT/CN2019/111257
§ 371 (c)(1),
(2) Date: Jan. 15, 2020

(87) PCT Pub. No.: WO2020/232957
PCT Pub. Date: Nov. 26, 2020

(65) Prior Publication Data
US 2022/0005920 A1 Jan. 6, 2022

(30) Foreign Application Priority Data

May 21, 2019 (CN) .......................... 201910422043.1

(51) Int. Cl.
*H01L 27/32* (2006.01)
*H01L 51/52* (2006.01)

(52) U.S. Cl.
CPC ...... *H01L 27/3286* (2013.01); *H01L 27/3276* (2013.01); *H01L 51/5281* (2013.01)

(58) Field of Classification Search
CPC ............... H01L 27/3262; H01L 27/322; H01L 51/5284; H01L 51/5218; H01L 51/5228;
(Continued)

(56) References Cited

U.S. PATENT DOCUMENTS 10,979,546 B2 * 4/2021 Gu ...................... H04M 1/0264
2004/0217353 A1 * 11/2004 Koo ..................... H01L 27/1285
257/E27.111
(Continued)

FOREIGN PATENT DOCUMENTS

CN 103258968 A 8/2013
CN 104183606 A 12/2014
(Continued)

OTHER PUBLICATIONS

International Search Report dated Feb. 26, 2020 PCT/CN2019/111257.

*Primary Examiner* — Allen L Parker
*Assistant Examiner* — David W Houston, III

(57) ABSTRACT

A display panel, including a main display area and a light-transmitting display area; wherein the main display area surrounds the light-transmitting display area; the display panel includes: a substrate; an organic electroluminescent element array, including a plurality of organic electroluminescent elements disposed on the substrate; the driving circuit array is disposed on the substrate and is adapted to be matched with a high voltage source and a low voltage source for driving each of the organic light-emitting electroluminescent elements; wherein in the light-transmitting display area, the driving circuit array includes a passive driving circuit array; the passive driving circuit array is configured to drive the organic electroluminescent element of the light-transmitting display area to display.

8 Claims, 5 Drawing Sheets

(58) Field of Classification Search
CPC ............... H01L 51/56; H01L 51/5234; H01L 2251/5315; H01L 27/3286; H01L 27/3276; H01L 51/5281; H01L 25/046; H01L 27/28; H01L 51/00; H01L 2031/0344; H01L 2251/00
USPC ........................................................ 257/40
See application file for complete search history.

(56) References Cited

U.S. PATENT DOCUMENTS

| | | | |
|---|---|---|---|
| 2005/0168491 A1* | 8/2005 | Takahara | G09G 3/3283 345/690 |
| 2007/0164294 A1 | 7/2007 | Kang et al. | |
| 2011/0148831 A1* | 6/2011 | Tamaki | H01L 51/5253 345/206 |
| 2014/0346968 A1* | 11/2014 | Meng | H01L 27/1285 257/E27.111 |
| 2016/0268239 A1 | 9/2016 | Shen et al. | |
| 2018/0211593 A1 | 7/2018 | Zhang | |
| 2018/0233550 A1* | 8/2018 | Han | H01L 27/3211 |
| 2019/0114020 A1* | 4/2019 | Ding | H01L 27/1285 257/E27.111 |
| 2020/0075701 A1* | 3/2020 | Song | H01L 51/56 |

FOREIGN PATENT DOCUMENTS

| | | |
|---|---|---|
| CN | 106486064 A | 3/2017 |
| CN | 108986678 A | 12/2018 |
| CN | 109300951 A | 2/2019 |
| CN | 109445171 A | 3/2019 |
| CN | 110233166 A | 9/2019 |

* cited by examiner

DISPLAY PANEL AND DISPLAY DEVICE

FIELD OF INVENTION

The present invention relates to the field of display, and in particular to a display panel and a display device.

BACKGROUND OF INVENTION

In the field of small and medium-size displays, full-screen technology has become the current important research and development direction, that is, how to maximize the screen ratio of the human-computer interaction interface by the related technology. The first generation of full-screen technology focused on 16:9 to 18:9 screen ratios or even larger. The second generation of full-screens is to further reduce the upper and lower boundaries of the screen and even adopt flexible folding technology to maximize a visible area. Another research direction of the recent full-screen is how to further integrate the fingerprint recognition, camera, face recognition, distance sensing and other sensors of the display terminal into display area of the display screen, so that the display screen gradually transforms from a simple display interface to comprehensive perception and interactive interface.

Current mainstream display technologies include liquid crystal displays (LCDs) and organic light-emitting diodes (OLEDs), wherein LCDs are passive light-emitting technologies. The brightness control of the optical fiber is realized by illuminating the liquid crystal cell by an entire backlight structure, and the OLED technology adopts active illuminating of individual OLED pixels. Compared with LCDs, OLEDs has advantages of high contrast, lightweight, thin thickness, flexible, and foldable. On the other hand, based on the characteristics that OLEDs do not need a backlight, they can be well compatible with current optical fingerprint recognition modules, so in-plane optical fingerprint recognition has become the "exclusive advantage" of the OLEDs. The industry has also developed an OLED-based camera screen solution that allows switching between a display mode and an image capture mode without the need of a conventional boring solution, which results in a boring area that is not displayable.

Technical Problem

However, the imaging under-screen usually requires a higher pixel density, so that the sensor has a small individual photosensitive unit and has a higher requirement for the transmittance of the OLED substrate. This is different from fingerprint recognition which only adopts light transmission between the OLED sub-pixels to meet the imaging needs. Conventional OLEDs are driven by an active driving (AM) method. The advantage of the active array driving is that it can be compatible with higher resolution, but the disadvantage is that more thin-film transistors (TFTs) are required for electrical connection. The most common driving architecture is 2T1C, and current consumer-grade products adopt a 7T1C architecture, wherein a plurality of TFT architectures constitute a huge opening occupation, which makes it difficult to achieve high transmittance design of OLED display, and consequently is difficult to be well compatible with an under-screen camera solution.

Therefore, it is necessary to propose a new display panel and a display device, which solves the problem of low transmittance of the camera area of current OLED and reduces an occupation of the opening by the TFT architectures. Consequently, realizing true full-screen technology.

SUMMARY OF INVENTION

An object of the present invention is to provide a display panel and a display device. The display panel has a main display area and a light-transmitting display area, wherein the main display area occupies most of the area and is driven by the same active array circuit. The light-transmitting display area is driven by a passive array circuit, and the non-metal wiring area and the light-emitting layer of the light-transmitting display area are designed to have high transmittance such that the light-transmitting display area has lower pixel density. Consequently, ensuring higher light transmittance.

In order to achieve the above object, the present invention provides a display panel, including a main display area and a light-transmitting display area. The display panel includes: a substrate; a driving circuit array disposed on a side of the substrate; an organic electroluminescent element array, including a plurality of organic electroluminescent elements disposed on a side of the driving circuit array away from the substrate. The driving circuit array is provided with a passive driving circuit array at a corresponding position of the light-transmitting display area, and the passive driving circuit array is configured to drive the organic electroluminescent element corresponding to the light-transmitting display area to display.

Further, the passive driving circuit array includes: a plurality of first data wires disposed along a first direction and a plurality of first scan wires disposed along a second direction. The first direction is not parallel to the second direction, and the organic electroluminescent elements each are electrically coupled to the first data wire and the first scan wire at an intersection of the first data wire and the first scan wire, respectively.

Further, in the main display area, the drive circuit array includes an active driving circuit array.

Further, the active driving circuit array includes a plurality of active drive circuits, the active driving circuits each are connected to the organic electroluminescent element. The active drive circuits each include: a second data wire disposed along a first direction; and a second scan wire disposed along a second direction, the first direction is not parallel to the second direction; and a control unit, the control unit is electrically coupled to the second scan wire and the second data wire.

Further, the control unit includes: a first thin film transistor having a first gate, a first source, and a first drain, the first gate is electrically coupled to the second scan wire, and the first drain is electrically coupled to the second data wire; a second thin film transistor having a second gate, a second source, and a second drain, the second gate is electrically coupled to the first source, and the second drain is electrically coupled to the organic electroluminescent element; and a capacitor electrically coupled between the second gate and the first source.

Further, the organic electroluminescent element array includes: an anode disposed on the driving circuit array; a hole injection layer disposed on a side of the anode away from the driving circuit array; a hole transport layer disposed on a side of the hole injection layer away from the anode; a light-emitting layer disposed on a side of the hole transport layer away from the hole injection layer; an electron transport layer disposed on a side of the light-emitting layer away from the hole transport layer; and a cathode disposed on a side of the electron transport layer away from the light-emitting layer.

Further, a pixel density of the main display area is greater than a pixel density of the light-transmitting display area; the pixel density of the main display area is 300-800 PPI (pixels per inch), and a pixel density of the light-transmitting display area is 100-300 PPI.

The present invention also provides a display device, including the display panel, the display device further includes: an electrical shielding layer disposed under the display panel; a polarizer disposed on a side of the display panel away from the electrical shielding layer; an optical adhesive layer disposed on a side of the polarizer away from the display panel; and a cover glass disposed on a side of the optical adhesive layer away from the polarizer.

Further, the polarizer is provided with a first through-hole corresponding to the light-transmitting display area, the electrical shielding layer is correspondingly provided with a second through-hole corresponding to the light-transmitting display area; and a sensor module is disposed in the second through-hole.

Beneficial Effect

The invention provides a display panel and a display device. The display panel has a main display area and a light-transmitting display area, wherein the main display area occupies most of the area and is driven by an active array circuit, typically adopting a 2T1C or 7T1C architecture, consequently achieving an optimal display effect and a higher pixel density. The light-transmitting display area is driven by a passive array circuit and adopts a high transmittance design, the light-emitting layer in the non-metal wiring area and the light-transmitting display area has high transmittance and low pixel density, consequently, ensuring a larger opening area.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

Figure 1:
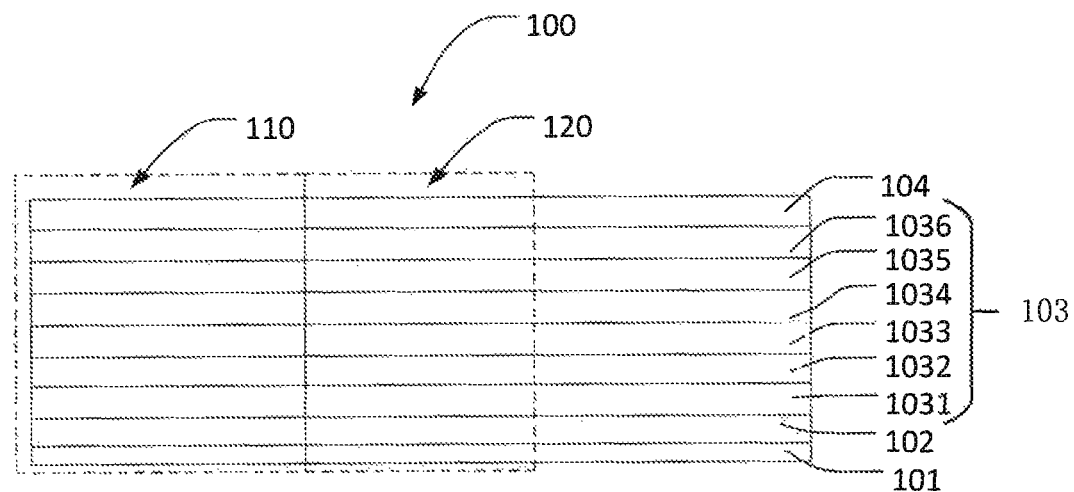
FIG. 1 is a schematic structural view of a display panel of the present invention.

REFERENCE NUMERALS display device 10, display panel 100, sensor module 30, main display area 110, light-transmitting display area 120, substrate 101, organic electroluminescent element array 103, driving circuit array 102, encapsulation layer 104, active driving circuit array 1022, passive driving circuit array 1021, data wire 130, scan wire 140, organic electroluminescent element 103a, control unit 150, first thin film transistor 1501, second thin film transistor 1502, capacitor 1503, first gate 1501a, first source 1501b, first drain 1501c, second gate 1502a, second source 1502b, second drain 1502c, electrical shielding layer 11, polarizer 12, optical adhesive layer 13, glass cover 14, second through-hole 111, light guide plate 201, backlight 202, high voltage source VDD, low voltage source VCC, first through-hole 121.

DETAILED DESCRIPTION OF PREFERRED EMBODIMENTS

The following description of the embodiments is provided to illustrate the specific embodiments of the invention. Directional terminology mentioned in the application, such as "above", "under", "front", "back", "left", "right", "inside", "outside", "side", etc., are only refer to the directions of the accompanying drawings. The sequential terminologies of the elements mentioned in the present invention, such as first, second, etc., are only used for distinguishing between different elements and for better expressed. In the drawings, structurally similar elements are denoted by the same reference numerals.

Embodiments of the present invention will be described in detail herein with reference to the drawings. The present invention may be presented in different forms and is not to be construed as being limited to the specific embodiments set forth herein. The embodiments of the present invention are provided to explain the practical application of the present invention so that those skilled in the art can understand various embodiments of the present invention and various modifications suitable for the particular intended application.

As shown in FIG. 1, the present invention provides a display panel 100, including a main display area 110 and a light-transmitting display area 120. The main display area 110 surrounds the light-transmitting display area 120, and the main display area 110 and the light-transmitting display area 120 can be used for displaying, consequently realize a full-screen display function.

A pixel density of the main display area 110 is greater than a pixel density of the light-transmitting display area 120; the pixel density of the main display area 110 is 300-800 PPI, most preferably 500 PPI, or it may be 400 PPI, 600 PPI or 700 PPI; and a pixel density of the light-transmitting display area is 100-300 PPI, most preferably 200 PPI, and may also be 150 PPI, 250 PPI or 280 PPI.

The display panel 100 includes a substrate 101, an organic electroluminescent element array 103, a driving circuit array 102, and an encapsulation layer 104.

The substrate 101 is a transparent substrate and the driving circuit array 102 is disposed on the substrate 101.

Figure 2:
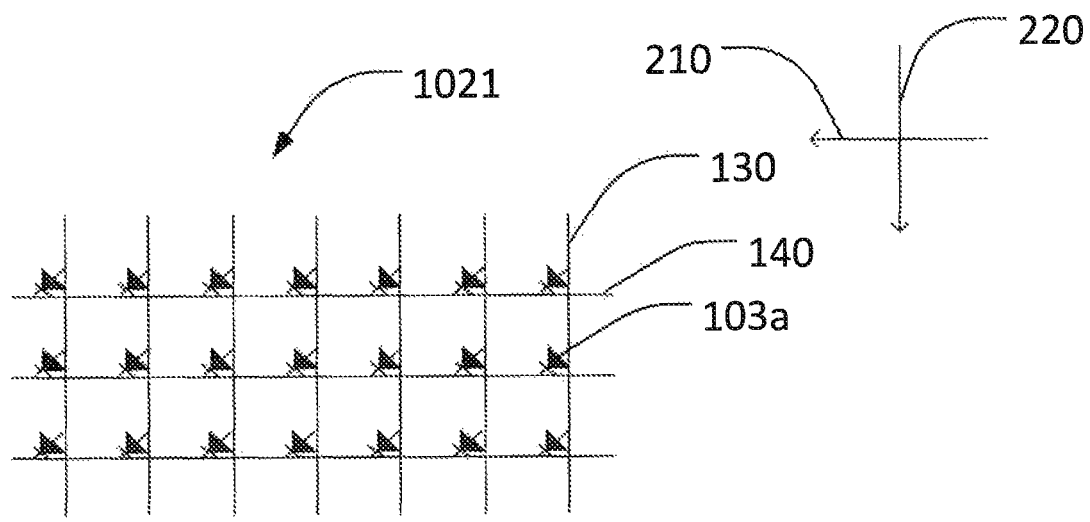
FIG. 2 is a circuit diagram of a passive driving circuit array of a light-transmitting display area of the present invention.

The organic electroluminescent element array 103 includes a plurality of organic electroluminescent elements 103a (as shown in FIG. 2). The organic electroluminescent element array 103 is disposed on a side of the driving circuit array 102 that is away from the substrate 101.

The driving circuit array 102 includes a plurality of driving circuits disposed on the substrate 101, that is, the driving circuit is adapted to match the high voltage source VDD and the low voltage source VCC for driving each of the organic electroluminescent elements 103a.

Figure 3:
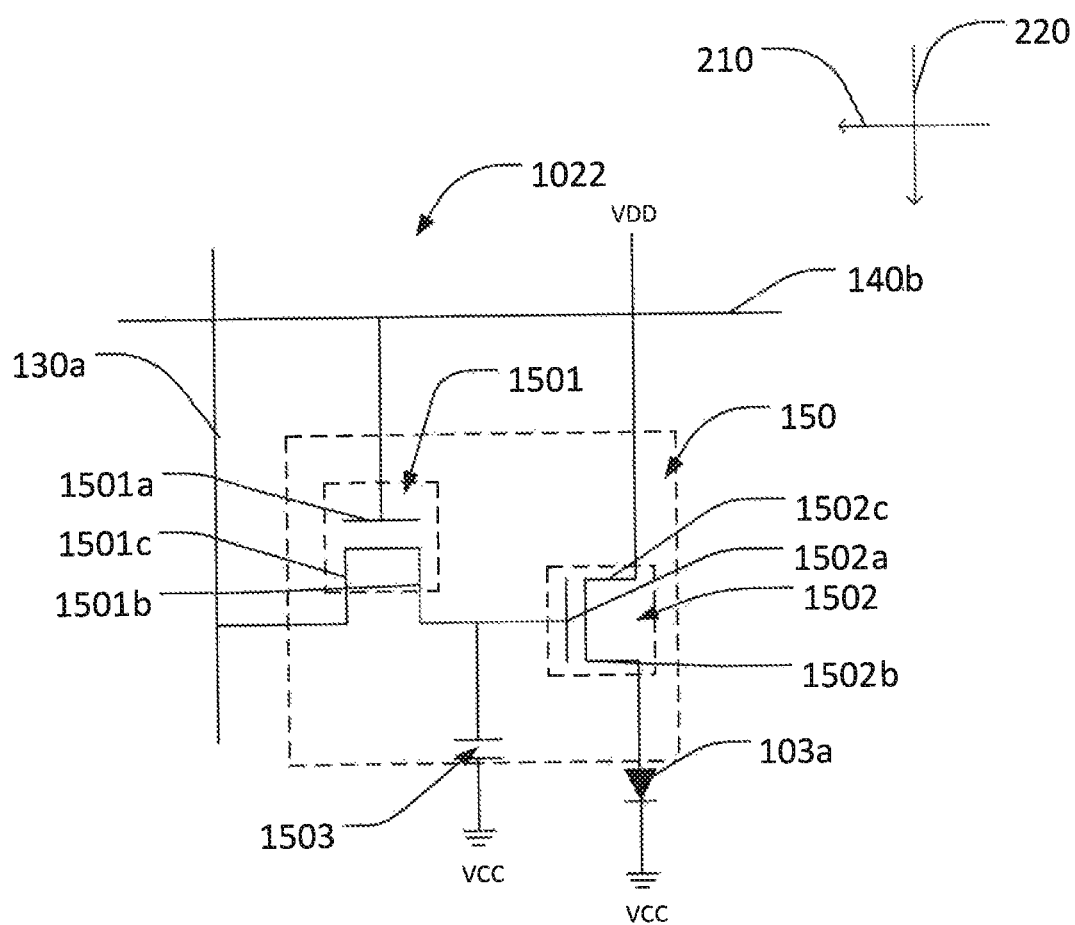
FIG. 3 is a circuit diagram of an active driving circuit array of a main display area of the present invention.

The driving circuit array 102 includes an active driving circuit array 1022 (as shown in FIG. 3) and a passive driving circuit array 1021 (as shown in FIG. 2); the active driving circuit array 1022 corresponds to the main display area 110, and the passive driving circuit array 1021 corresponds to the light-transmitting display area 120.

As shown in FIG. 2, in the light-transmitting display area 120, the passive driving circuit array 1021 includes a plurality of first data wires 130 disposed along the first direction 210 and a plurality of second scan wires 140 disposed along the second direction 220. The first direction 210 is not parallel to the second direction 220. In the present invention, the first direction 210 is perpendicular to the second direction 220.

At the intersection of the first data wire 130 and the first scan wire 140, each of the organic electroluminescent elements 103a is electrically coupled to the first data wire 130 and the first scan wire 140, respectively. It can drive the organic electroluminescent element 103a of the light-transmitting display area 120 to emit light for display.

As shown in FIG. 3, in the main display area 110, the active driving circuit array 1022 includes a plurality of active driving circuits, and each of the active driving circuits is connected to the organic electroluminescent element 103a. The active driving circuit array 1022 typically adopts a 2T1C or 7T1C architecture.

Each active driving circuit includes a second data wire 130a, a second scan wire 140a, and a control unit 150.

The second data wire 130a is disposed along the first direction 210, and the second scan wire 140a is disposed along the second direction 220. The first direction is not parallel to the second direction.

The control unit 150 is electrically coupled to the second scan wire 140a, the second data wire 130a, and the low voltage source VCC. The corresponding organic electroluminescent element 103a is electrically coupled between the control unit 150 and the high voltage source VDD.

The control unit 150 includes a first thin film transistor 1501, a second thin film transistor 1502, and a capacitor 1503.

The first thin film transistor 1501 has a first gate 1501a, a first source 1501b, and a first drain 1501c. The first gate 1501a is electrically coupled to the second scan wire 140a, and the first drain 1501c is electrically coupled to the second data wire 130a.

The second thin film transistor 1502 has a second gate 1502a, a second source 1502b, and a second drain 1502c. The second gate 1502a is electrically coupled to the first source 1501b, and the second source 1502b is electrically coupled to the high voltage source VDD, and the second drain 1502c is electrically coupled to the organic electroluminescent element 103a. The capacitor 1503 is electrically coupled between the second gate 1502a and the first source 1501b. It realizes the light-emitting display of the organic electroluminescent element 103a that drives the main display area 110.

Please refer to FIG. 1, the organic electroluminescent device array 103 includes an anode 1031, a hole injection layer 1032, a hole transport layer 1033, a light-emitting layer 1034, an electron transport layer 1035, and a cathode 1036.

The anode is disposed on the driving circuit array 102; the hole injection layer 1032 is disposed on a side of the anode away from the driving circuit array 102. The hole transport layer 1033 is disposed on a side of the hole injection layer 1032 away from the anode 1031. The light-emitting layer 1034 is disposed on a side of the hole transport layer 1033 away from the hole injection layer 1032. The electron transport layer 1035 is disposed on a side of the light-emitting layer 1034 away from the hole transport layer 1033. The cathode 1036 is disposed on a side of the electron transport layer 1035 away from the light-emitting layer 1034.

The anode 1031 is electrically coupled to the high voltage source VDD, and the cathode 1036 is electrically coupled to the second drain 1052c.

The encapsulation layer 104 is disposed on a side of the organic electroluminescent element array 103 away from the substrate 101. The encapsulation layer 104 serves to protect the organic electroluminescent element array 103 from water and oxygen.

Figure 4:
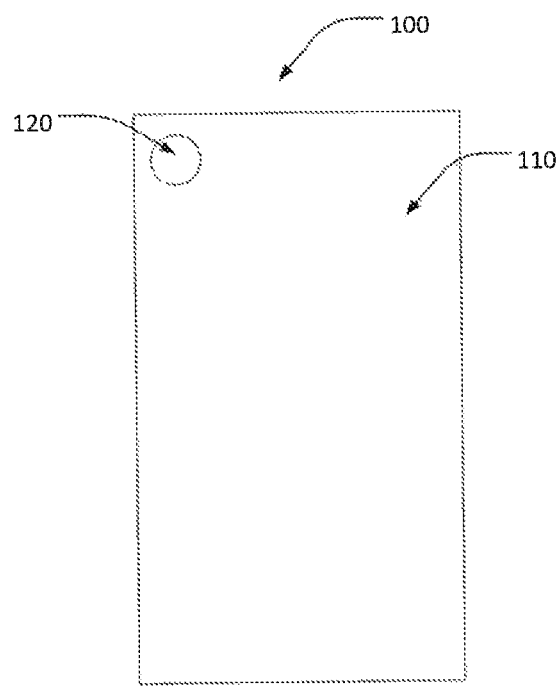
FIG. 4 is a schematic structural view of a circular hole screen of a display panel of the present invention.
Figure 5:
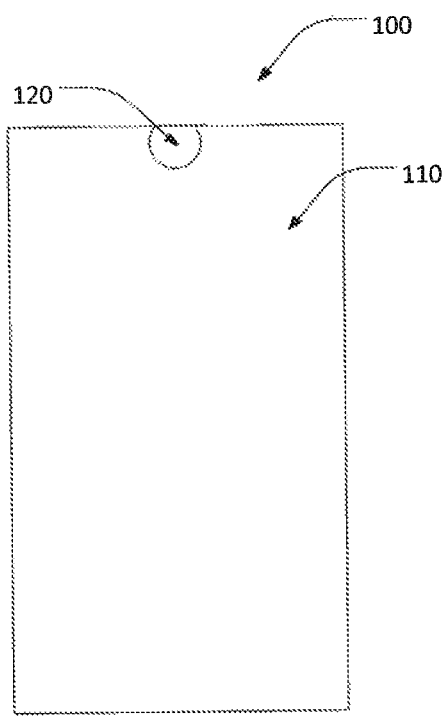
FIG. 5 is a schematic structural view of a water drop screen of a display panel of the present invention.
Figure 6:
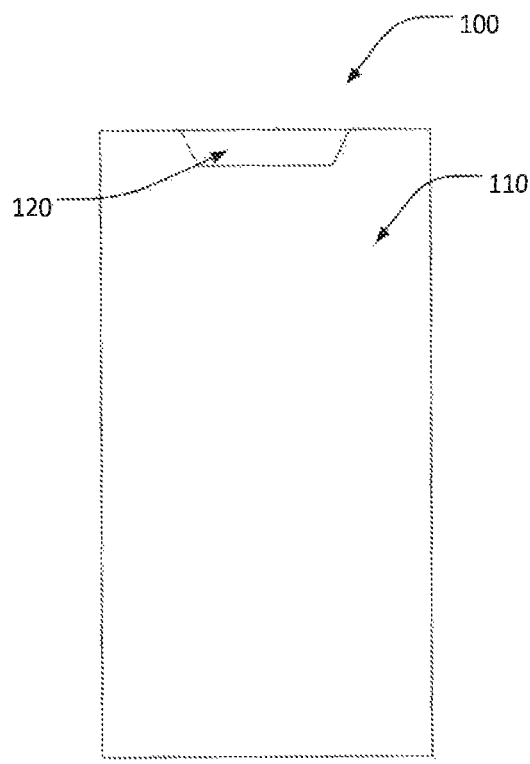
FIG. 6 is a schematic structural view of a groove screen of a display panel of the present invention.
Figure 7:
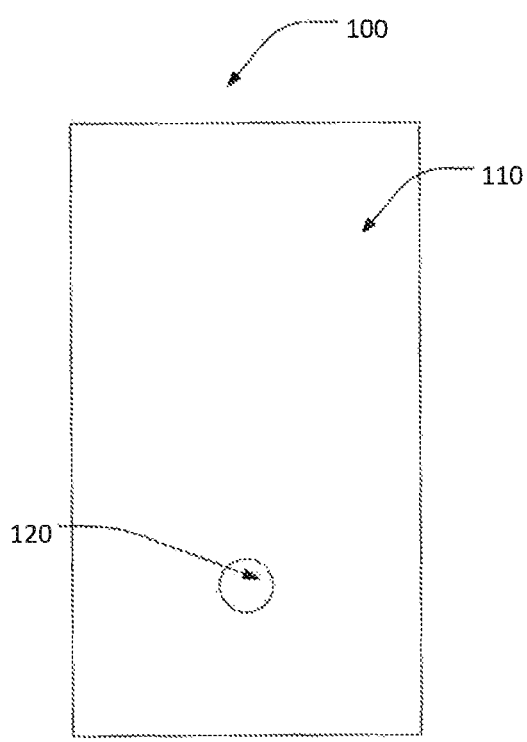
FIG. 7 is a schematic structural view of a fingerprint circular hole screen of a display panel of the present invention.
Figure 8:
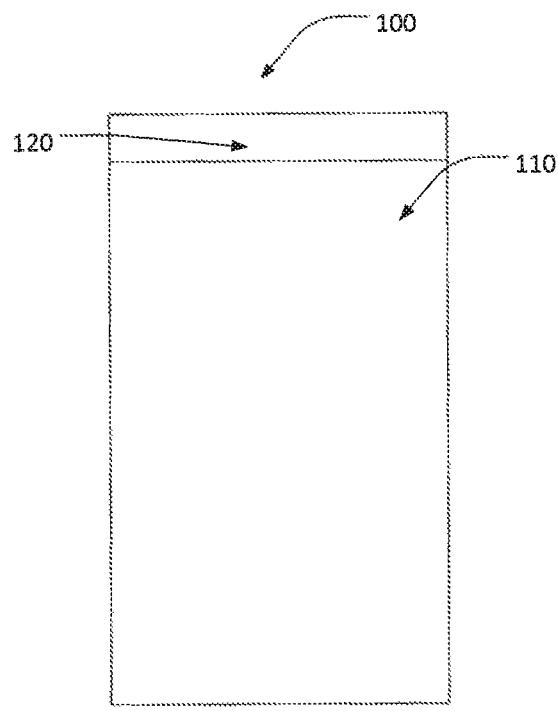
FIG. 8 is a schematic structural view of a light-transmitting display area of the present invention.

As shown in FIGS. 4-8, the shape of the light-transmitting display area 120 mentioned in the present invention is not limited. Generally, it is a round hole shape (as shown in FIG. 4 or 7), or it can be a "waterdrop" (as shown in FIG. 5), "groove" (as shown in FIG. 6), "a screen with a notch", and "square screen" shape (as shown in FIG. 8).

The invention provides a display panel 100, the display panel 100 has a main display area 110 and a light-transmitting display area 120, wherein the main display area 110 occupies most of the area and is driven by the same active array circuit, typically adopting a 2T1C or 7T1C architecture, consequently achieving an optimal display effect and a greater pixel density.

The light-transmitting display area 120 is driven by a passive array circuit and adopts a high transmittance design, the light-emitting layer in the non-metal wiring area and the light-transmitting display area 120 has high transmittance and low pixel density, consequently, ensuring a larger opening area. The light-transmitting display area 120 has a small area, and thus the number of pixels is small, and the visual effect influenced on the overall display is also low. The light-transmitting display area 120 performs optical signal acquisition by sensing under the display panel 100 to obtain better image quality.

Figure 9:
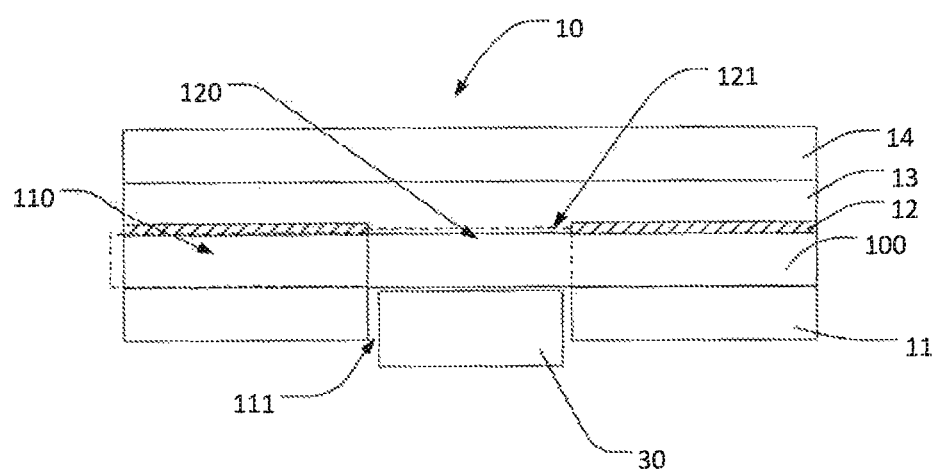
FIG. 9 is a schematic structural view of a display device of the present invention.

As shown in FIG. 9, the present invention further provides a display device 10 including the display panel 100, the electrical shielding layer 11, the polarizer 12, the optical adhesive layer 13, and the glass cover 14.

The electrical shielding layer 11 is disposed under the display panel 100. The polarizer 12 is disposed on a side of the display panel 100 away from the electrical shielding layer 11. The optical adhesive layer 13 is disposed on a side of the polarizer 12 away from the display panel 100, and the cover glass 14 is disposed on a side of the optical adhesive layer 13 away from the polarizer 12.

The polarizer 12 is provided with a first through-hole 121 at the light-transmitting display area 120. The first through-hole 121 further ensures high transmittance of the display device 10 and improves an optical signal acquisition of the sensor module 30.

The electrical shielding layer 11 is provided with a second through-hole 121 at the light-transmitting display area 120, and the second through-hole 121 is provided with a sensor module 30.

The sensor module 30 is typically a camera module and can be a fingerprint recognition module, a structured light sensor module, a time-of-flight sensor module, a distance sensor module, and a light sensor module.

The invention provides a display device 10, of which the display panel 100 has a main display area 110 and a light-transmitting display area 120, wherein the main display area 110 occupies most of the area and is driven by the same active array circuit, typically adopting a 2T1C or 7T1C architecture, consequently achieving optimal display effect and higher pixel density.

The light-transmitting display area 120 is driven by a passive array circuit and adopts a high transmittance design, the light-emitting layer in the non-metal wiring area and the light-transmitting display area 120 has high transmittance and low pixel density, thereby, ensuring a larger opening area. The light-transmissive display area 120 has a smaller area and a smaller number of pixels, so its visual impact on the overall display effect is minor. Further, the upper and lower polarizers 11 attached to the display panel 100 are apertured to ensure higher transmittance. In this way, the sensor module 30 performs optical signal acquisition through the light-transmitting display area 120 to realize better image quality.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A display device, comprising:
    a display panel, comprising a main display area and a light-transmitting display area;
    an electrical shielding layer disposed under the display panel;
    a polarizer disposed on a side of the display panel away from the electrical shielding layer;
    an optical adhesive layer disposed on a side of the polarizer away from the display panel; and
    a cover glass disposed on a side of the optical adhesive layer away from the polarizer;
    wherein the display panel comprises:
        a substrate;
        a driving circuit array disposed on a side of the substrate;
        an organic electroluminescent element array, comprising a plurality of organic electroluminescent elements disposed on a side of the driving circuit array away from the substrate;
        wherein the driving circuit array is provided with a passive driving circuit array at a corresponding position of the light-transmitting display area, and the passive driving circuit array is configured to drive the plurality of organic electroluminescent elements corresponding to the light-transmitting display area to display; and
        wherein the passive driving circuit array comprises a plurality of first data wires disposed along a first direction and a plurality of first scan wires disposed along a second direction, the first direction is not parallel to the second direction, and wherein the plurality of organic electroluminescent elements each are electrically coupled to one of the plurality of first data wires and one of the plurality of first scan wires at intersections of the plurality of first data wires and the plurality of first scan wires, respectively.

2. The display device according to claim 1, wherein in the main display area, the drive circuit array comprises an active driving circuit array.

3. The display device according to claim 2, wherein the active driving circuit array comprises a plurality of active drive circuits, the active driving circuits each are connected to the organic electroluminescent element array; the active drive circuits each comprise:
    a second data wire disposed along a first direction, and a second scan wire disposed along a second direction, the first direction is not parallel to the second direction, and a control unit, the control unit is electrically coupled to the second scan wire and the second data wire.

4. The display device according to claim 3, wherein the control unit comprises:
    a first thin film transistor having a first gate, a first source, and a first drain, the first gate is electrically coupled to the second scan wire, and the first drain is electrically coupled to the second data wire;
    a second thin film transistor having a second gate, a second source, and a second drain, the second gate is electrically coupled to the first source, and the second drain is electrically coupled to the organic electroluminescent element; and
    a capacitor electrically coupled between the second gate and the first source.

5. The display device according to claim 1, wherein the organic electroluminescent element array comprises:
    an anode disposed on the driving circuit array;
    a hole injection layer disposed on a side of the anode away from the driving circuit array;
    a hole transport layer disposed on a side of the hole injection layer away from the anode;
    a light-emitting layer disposed on a side of the hole transport layer away from the hole injection layer;
    an electron transport layer disposed on a side of the light-emitting layer away from the hole transport layer; and
    a cathode disposed on a side of the electron transport layer away from the light-emitting layer.

6. The display device according to claim 1, wherein a pixel density of the main display area is greater than a pixel density of the light-transmitting display area; the pixel density of the main display area is 300-800 PPI, and a pixel density of the light-transmitting display area is 100-300 PPI.

7. The display device according to claim 1, wherein the polarizer is provided with a first through-hole corresponding to the light-transmitting display area, the electrical shielding layer is correspondingly provided with a second through-hole corresponding to the light-transmitting display area; and a sensor module is disposed in the second through-hole.

8. The display device according to claim 7, wherein the sensor module comprises but is not limited to a fingerprint recognition sensor, a structured light sensor, a time of flight sensor, a distance sensor, and a light sensor.

* * * * *